July 6, 1971 A. R. CLAWSON ET AL 3,591,429

SULFUR DOPED RECRYSTALLIZED INSB FILMS

Filed July 25, 1968

ARTHUR R. CLAWSON
HARRY H. WIEDER
*INVENTORS*

BY J. M. St. Amand
ATTORNEY

United States Patent Office 3,591,429

Patented July 6, 1971

3,591,429

SULFUR DOPED RECRYSTALLIZED InSb FILMS

Arthur R. Clawson and Harry H. Wieder, Riverside, Calif., assignors to the United States of America as represented by the Secretary of the Navy Filed July 25, 1968, Ser. No. 747,511
Int. Cl. H01l 7/36; C23c 13/00; C01g 15/00
U.S. Cl. 148—174 3 Claims

ABSTRACT OF THE DISCLOSURE

A process by which recrystallized films of semi-conducting InSb can be donor doped at a predetermined impurity level. Pure indium from which the InSb films are prepared is saturated with sulfur (a donor impurity in InSb) by diffusion. 99.999% pure sulfur and 99.999% pure indium are sealed in vacuum in separate compartments of a pyrex ampoule and heated at 150° C. for several days to saturate the indium with sulfur. A layer of $In_2S_3$ formed on the indium is removed in a $Na_2S$ solution. The impurity level in the InSb film is controlled by diluting the sulfur doped indium with 99.9999% pure indium in the necessary proportion for the doping level desired; this permits introducing donor impurity levels up to $8\times10^{18}$ cm.$^{-3}$.

The invention herein described may be manufactured and used by or for the Government of the United States of America for governmental purposes without the payment of any royalties thereon or therefor.

This invention is for a process by which semi-conducting films of recrystallized InSb can be doped with a donor impurity in a controlled manner. The usefulness of semi-conducting InSb is dependent on the impurity concentration. For some applications very pure InSb is desirable, for example a Hall generator in which maximum sensitivity is desired. Along with a high Hall voltage, however, the pure InSb also has a very high Hall voltage temperature coefficient. For other applications this dependence of Hall voltage on temperature cannot be tolerated. In this case a donor-doped InSb can have an advantage. Although the increased donor concentration lowers the Hall voltage, the temperature dependence is much less.

At room temperature pure InSb is in the intrinsic conduction region. The charge carriers are thermally generated, thus their concentration is highly dependent on temperature. The observed conduction is n-type in intrinsic InSb because the contribution due to acceptors is small enough to be neglected. To reduce the temperature dependence of the donor concentration the quantity of impurity donors is increased to provide the major portion of charge carriers. The concentration of impurity donors is temperature invarient, thus the Hall voltage becomes less influenced by temperature. Other applications, either electrical or optical, for which donor doped InSb films can be used, will benefit from the process described herein.

The controlled doping of InSb films with donor impurities are desirable for two reasons. On the one hand, a comparison between the impurity concentration-dependent galvanomagnetic coefficients of films and of bulk crystalline InSb can be used for research purposes on the origin of the low electron mobility and the relevant charge carrier scattering mechanism in films. On the other hand, donor impurity doping offers practical advantages. It can bring about a reduction in the temperature dependence of thin film galvanomagnetic devices by decreasing the fraction of thermally activated charge carriers to the total electron concentration.

Dendritic InSb films grown by the recrystallization from the liquid phase of composite (In+Sb) films are invariably n-type. Their electron concentration, at about 300° K., is $n\geq2\times10^{16}$ cm.$^{-3}$; their electron mobility, $$\mu_n\leq5.7\times10^4$$

cm.$^2$/Vs and the magnetoresistance, which should be negligible in long rectangular specimens, is $(\Delta\rho/\rho_0)\simeq1$ in 10 koe. This has been ascribed to local fluctuations in carrier concentration which arise in consequence of an inhomogeneous impurity distribution. Such inhomogeneities can produce a magnetic field-dependent distortion of the current streamlines and thus an additional contribution to any magnetoresistance of geometrical origin present in the films.

Vacuum deposited InSb films, with the exception of those flash-evaporated under homo-epitaxial growth conditions, are polycrystalline. Their electron mobilities are considerably lower than those of bulk crystalline InSb with the same impurity concentration. A good correlation has been established between electron mobility and the mean size of the crystallites in a film; this has been attributed to grain boundary scattering and the anomalous temperature dependence of electron mobility $\mu_n$ has been interpreted in terms of dislocation scattering, in accordance with the mechanism proposed by D. L. Dexter and F. Seitz, Phys. Rev. 86, 964 (1952).

There has been no previous technique for introducing a predetermined amount of impurity into recrystallized InSb films. The impurity concentration of InSb films previously prepared by recrystallization has been determined solely by the purity of the initial materials and any contamination during the processing.

The process of this invention provides a simple, direct, predictable method of producing n-type InSb recrystallized films. The donor concentration is directly controlled by the fraction of sulfur doped indium used in the preparation of the initial vacuum deposited film.

Other objects and many of the attendant advantages of this invention will become readily appreciated as the same becomes better understood by reference to the following detailed description when considered in connection with the accompanying drawings wherein.

The preparation of dendritic InSb films consists in the vacuum deposition of composite (In+Sb) layers on the same glass substrate, the growth, by oxidation of a passive surface $In_2O_3$ layer, melting of the composite film, followed by crystallization of the liquid film in a suitable temperature gradient. Details of this procedure have been described by H. H. Wieder, Solid State Commun. 3, 159 (1965).

Sulfur is a donor impurity in InSb. It is introduced into the InSb films by doping all or part of the In source material prior to its use for vacuum deposition of the composite (In+Sb) layers. This is done by diffusing 99.999% pure sulfur into (approximately 1 mm. diameter) indium pellets, whose purity is greater than 99.999%. For example, approximately 4 g. of indium is placed in one compartment of a double-chamber Pyrex ampoule and about 1 g. of sulfur in the other compartment. The ampoule is then evacuated, sealed, and then kept at 150° C. for five days. (The melting temperature of indium is 156° C. There is no need to limit, for safety reasons, the quantity of sulfur in the ampoule because its vapor pressure does not exceed one atmosphere below 480° C.) A yellow-brown coating presumed to be $In_2S_3$, appears after this time on the indium pellets and is easily removed by etching in a $Na_2S$ solution.

Each of the films, whose properties are described subsequently, can be prepared from composite (In+Sb) films by the complete co-evaporation in vacuum of, for example, 300 mg. of In and 310 mg. of Sb. In order to vary the concentration of sulfur in the InSb films, a variable fraction of the In source material can consist of the sulfur-doped pellets and the rest of 99.9999% pure In.

All the films, irrespective of sulfur concentration have the same Debye-Sherrer patterns, i.e. polycrystalline with a strong {111} crystallographic texture. The thickness of most of the films chosen for the subsequently described electrical measurements was determined to be $$d=1.98\pm0.14\ \mu_m$$

with the exception of four specimens. One, 2.59 $\mu_m$ thick is identified by its carrier concentration, $n=5.1\times10^{17}$ cm.$^{-3}$, the other 2.45 $\mu_m$ thick has $n=8\times10^{16}$ cm.$^3$. The other two specimens, $d=1.60$ $\mu_m$ and $d=1.67$ $\mu_m$ are identified by their respective carrier concentrations $$n=1.73\times10^{18}\ \text{cm.}^{-3}$$

and $n=5.5\times10^{17}$ cm.$^{-3}$.

The resistivity $\rho$, Hall coefficient R and electron mobility $\mu_n$ of the films have been evaluated at 295° K. and at 77° K. Conventional measurement techniques on rectangular specimens as well as van der Pauw's method have been used to determine the impurity concentration $N_d$ from the value of R at 77° K. The degree of compensation by acceptor impurities was considered to be negligible. This is certainly justified for $n\geq10^{17}$ cm.$^{-3}$ on the basis of detailed measurements made on undoped InSb films.

Figure 1:
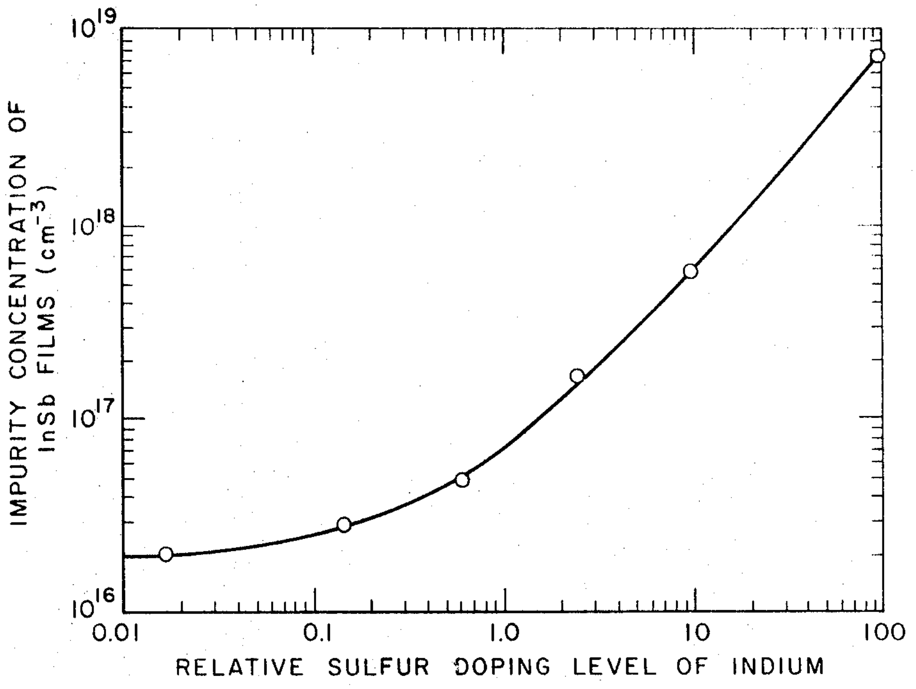
FIG. 1 shows the impurity concentration in recrystallized dendritic InSb films as a function of the relative concentration of sulfur in the indium source material, used for the vacuum deposition of the composite (In+Sb) layers.

FIG. 1 shows the dependence of the impurity concentration in the InSb films on the relative sulfur concentration in the indium source material. The residual donor concentration of undoped dendritic InSb films, $$N_d=2\times10^{16}\ \text{cm.}^{-3}$$

was subtracted from the experimental data. The maximum impurity concentration (about 0.05 atm. percent of sulfur in indium) $N_d=7.5\times10^{18}$ cm.$^{-3}$, obtained by the use of the undiluted sulfur-doped pellets, corresponds to the limit of the solubility of sulfur in indium. FIG. 1 suggests that relatively little sulfur is lost by dissociation of the sulfur diffused in the indium and its vaporization during synthesis and growth of the InSb films.

Figure 2:
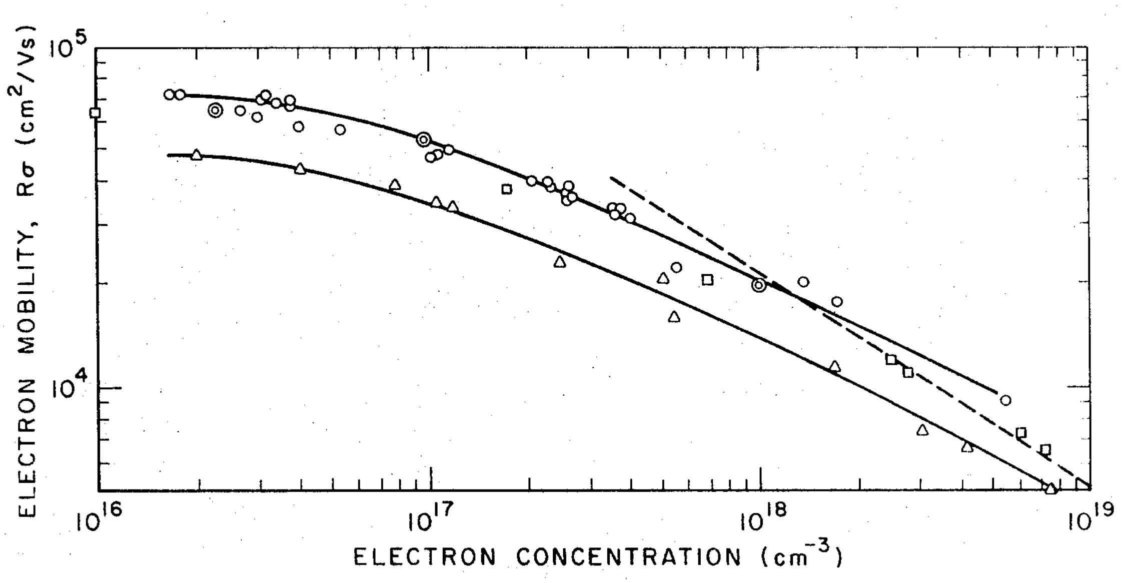
FIG. 2 shows electron mobility $\mu=R\sigma$, at 295° K., as a function of the electron concentration; open circles represent experimentally measured data on bulk single crystal Te-doped InSb; open squares represent data measured on donor-doped bulk InSb and concentric circles represent their calculated data. Triangles show experimental measurements made on sulfur-doped films.

FIG. 2 shows the electron mobility of such films as a function of the electron concentration measured at 295° K. FIG. 2 also shows the measurements (open circles) of $\mu_n$ vs. $n$, obtained by H. Rupprecht, R. Weber and H. Weiss, Z. Naturforsch. 15a, 783 (1960), on Te-doped single crystal bulk InSb, and the data abstracted from the measurements (open squares) of Galavanov et al., Phys. Stat. Sol. 8, 671 (1965), and Sov. Phys. Solid State 6, 2136 and 2777 (1965), and cocentric circle represent calculated data. Triangles show experimental measurements made on sulfer-doped films. If $\mu_B$ and $\mu_F$ are defined respectively as the bulk and film electron mobilities, then for $n<10^{18}$ cm.$^{-3}$:

$$\log\mu_F\simeq\log\mu_B-\log x \quad (1)$$

From FIG. 2, $x\simeq1.5$ and $\mu_F\simeq\mu_B/x$ thus $$\mu_F\simeq2/3\ \mu_B \quad (2)$$

FIG. 2 shows that in the range between $n=10^{18}$ cm.$^{-3}$ and $n=10^{19}$ cm.$^{-3}$ there is considerable scatter in the experimental data. It is assumed that the dashed line with slope, $d(\log\mu_B)/d(\log n)=-(2/3)$ represents the effective bulk mobility dependence on carrier concentration in this strongly degenerate range. The implications of this assumption are discussed subsequently.

At 295° K., the dominant electron scattering mechanism in intrinsic bulk InSb is optical mode lattice scattering. The relaxation time approximation is inapplicable because the Debye temperature of the optical mode phonons is 290° K. Nevertheless, Galavanov et al., supra, have shown that an equation of the form $$\frac{1}{\mu_B}=\frac{1}{\mu_O}+\frac{1}{\mu_I} \quad (3)$$

can be used to describe the mobility of donor-doped InSb, to within 7% of the experimentally measured values, at 300° K. as well as at 773° K. Equation 3, where $\mu_O$ is the optical mode lattice scattering mobility and $\mu_I$ is the ionized impurity scattering mobility, is at best an approximation because of the different energy dependences of the respective relaxation times $\tau_O$ and $\tau_I$. If it is assumed that $$\frac{1}{\mu_F}=\frac{1}{\mu_O}+\frac{1}{\mu_I}+\frac{1}{\mu_D} \quad (4)$$

where $\mu_D$ is the mobility produced by dislocation scattering, then for $n\leq10^{18}$ cm.$^{-3}$:

$$\mu_D=\left[\frac{1}{x-1}\right]\mu_B\simeq1\mu_B \quad (5)$$

For intrinsic InSb at 300° K., Galavanov et al., supra, found a value of $\mu_B=7.1\times10^4$ cm.$^2$/Vs, $\mu_I=2.7\times10^5$ cm.$^2$/VS and $\mu_O=1\times10^5$ cm.$^2$/Vs. Thus $\mu_D\simeq1.42\times10^5$ cm.$^2$/Vs, while from the data of Rupprecht et al., supra, $\mu_B\simeq8\times10^4$ cm.$^2$/Vs and thus $\mu_D\simeq1.6\times10^5$ cm.$^2$/Vs. This suggests that $\mu_D$ are roughly of the same order of magnitude.

The electron mobility of a strongly degenerate electron gas, such as present in InSb with $n\geq10^{18}$ cm.$^{-3}$, can be expressed as $$\mu_I=\frac{3h^3\epsilon^2}{16\pi^2e^3m^{*2}\cdot f(y)} \quad (6)$$

where $y=(h/e)^2(\epsilon/m^*)(3n/8\pi)^{1/3}$ and $f(y)$ is a slowly varying function of $y$, of the form $$f(y)=\log(1+y)-\frac{y}{1+y} \quad (7)$$

Here $m^*$ is the effective electron mass, $\epsilon$ the dielectric constant, $h$ is Planck's constant and $e$ the charge on the electron.

The dependence of $\mu_I$ on $n$ can be considered to arise primarily because of dependence of $m^*$ on $n$. If this is expressed as $\mu_I=c_1/m^*2$, where $c_1$ is a constant of proportionality, then since $m^*$ increases approximately as $n^{1/3}$:

$$\mu_I=c_1n^{-2/3} \quad (8)$$

The polar optical lattice scattering mobility has a weaker dependence on the electron concentration and can be represented by $\mu_O=c_2n^{-1/3}$, thus $$\mu_B=\frac{c_1n^{-2/3}}{1+(c_1/c_2)n^{-1/3}} \quad (9)$$

If $(c_1/c_2)n^{-1/3}\ll1$ then $$\log\mu_B\simeq-(2/3)\log n+\log c_1 \quad (10)$$

The slope $(-2/3)$ is in accord with the dashed line shown in FIG. 2.

The dislocation scattering mobility, introduced in Equation 4, assuming Maxwell-Boltzmann statistics and an isotropic distribution of edge dislocations through a film, can be expressed as $$\mu_D=\frac{32}{3\mu}\left[\frac{kTh}{\epsilon_1^2\lambda^2}\right]\left[\frac{1-\nu}{1-2\nu}\right]^2\cdot\left[\frac{e}{m^*N_D}\right] \quad (11)$$

where $k$ is Boltzmann's constant, T the absolute temperature, $\nu$ is Poisson's ratio, $N_D$ is the dislocation density, $\lambda$ the unit crystallographic slip distance, and $\epsilon_1$ is the deformation potential constant. H. Ehrenreich, J. Physics. Chem. Solids, 2, 131 (1957), has calculated $\epsilon_1=-7.2$ ev.

from the experimentally measured compressibility and the pressure dependence of the band cap. This value used with $\mu_D=1.5\times10^5$ cm.$^2$/Vs, $\lambda=6.48$ A., $\nu=0.4$, $$m^*+0.013$$

$m_o$ and T=295° K. allows the calculation of the dislocation density by means of Equation 11 as $N_D=1.8\times10^9$ cm.$^{-2}$. This is considered to be the dislocation density of intrinsic InSb films ~2 $\mu_m$ thick with a dendritic texture. $N_D$ is assumed to be independent of the carrier concentration. Equation 11 employed in conjunction with an expression of the form $\mu_O=1.09\times10^9\times T^{-1.68}$, has been used to account for the observed peak in $\mu_F$ vs. T of the films, the anomalous decrease in $\mu_n$ at low temperatures and the shift of the peak of $\mu_F(T)$ toward higher temperatures as the mean size of the crystallites decreases.

Because the effective electron mass depends on the carrier concentration, $\mu_D$ is expected to depend on $n$. The deformation potential constant $\epsilon_1$ is a function of $m_O^*$, the effective mass of electrons at the bottom of the conduction band. However $m_O^*$ is less likely to be dependent on $n$ than is $m^*$ at the Fermi level. Taking $\epsilon_1$ to be independent of $n$, then from Equation 11 $\mu_D=c_3n^{-1/3}$. The film mobility can be expressed for $n>10^{18}$ cm.$^{-3}$, as $$\mu_F=\frac{c_1n^{-2/3}}{1+(c_1/c_3)n^{-1/3}} \quad (12)$$

Its derivative with respect to $n$ is:

$$\left[\frac{d\mu_F}{dn}\right]=\left[\frac{d\mu_B}{dn}\right]\frac{2+(c_1/c_3)n^{-1/3}}{2[1+(c_1/c_3)n^{-1/3}]^2} \quad (13)$$

where $(d\mu_B/dn)=-(2/3)(\mu_B/n)$. Consider the case $|d\mu_F/dn|<|d\mu_B/dn|$; this corresponds to the inequality:

$$[2+(\mu_B/\mu_D)]>(1/2) \quad (14)$$

Since the ratio $(\mu_B/\mu_D)$ is always positive $|d\mu_B/dn|$ must be greater than $|d\mu_F/dn|$. The dashed line in FIG. 2 represents $(d\mu_B/dn)$. It has obviously a larger slope than the experimentally determined $(d\mu_F/dn)$. The tentative conclusion is that dislocation scattering is responsible for the experimental data shown in FIG. 2.

The view, that the low mobility of the films in comparison with bulk InSb is caused by ionized vacancies and interstitials, is a less likely mobility limiting mechanism. Plastic deformation of bulk InSb by uniaxial compression has been suggested by Duga et al., J. Appl. Phys. 30, 1798 (1959), to lead to the formation of ionized vacancies and interstitials in approximately equal densities. The differential stress developed between a film and its substrate, while it is cooling from the crystallization temperature to room temperature, could produce such a plastic deformation in the film. If this results in the formation of ionized lattice defects, then it appears reasonable to expect that at high chemical impurity concenrations the contribution of the lattice defects to the total impurity concentration would be negligible; therefore $\mu_F(n)$ should then merge with $\mu_B(n)$. This, however, is not the case, as shown by the data in FIG. 2.

Selenium and tellurium are other donor doping materials that can be used for doping InSb.

Obviously many modifications and variations of the present invention are possible in the light of the above teachings. It is therefore to be understood that within the scope of the appended claims the invention may be practiced otherwise than as specifically described.

What is claimed is:

1. A process for producing n-type recrystallized InSb films, containing a predetermined and desired amount of sulfur as a donor impurity, in a controlled and reproducible manner, comprising:

(a) doping at least a portion of a quantity of pellets of indium with sulfur, by:

(1) placing approximately 4 parts by weight of 99.999% pure indium pellets in one compartment of a double-chamber ampoule and 1 part by weight of 99.999% pure sulfur in the other compartment of said ampoule, (2) evacuating, sealing and heating said ampoule containing the indium and sulfur at 150° C. for approximately five days causing sulfur to diffuse into said indium pellets until the indium is saturated with the sulfur at about 0.05 atm. percent sulfur in indium, (3) taking the sulfur saturated indium pellets from the ampoule and removing a yellow-brown coating of $In_2S_3$ from said pellets by etching in $Na_2S$ solution, (b) co-evaporating in vacuum stoichoimetric amounts of doped indium source material pellets and antimony source material onto a non-conducting substrate, without significant loss of sulfur by dissociation of the sulfur diffused in the indium and its vaporization during synthesis and growth of the InSb film, (c) precisely varying the concentration of sulfur intorduced into said polycrystalline InSb films by mixing predetermined amounts of said sulfur saturated indium pellets with 99.999% pure indium pellets for use as said indium source material resulting in InSb films having a strong {111} crystallographic texture, (d) forming a passive surface $In_2O_3$ layer by oxidation, than melting the composite film, and finally recrystallization of the liquid film.

2. A process as in claim 1 wherein sulfur as a donor impurity is introduced into InSb films to levels up to $8\times10^{18}$ cm.$^{-3}$.

3. A process as in claim 1 wherein said indium pellets are approximately 1 mm. diameter.

References Cited

UNITED STATES PATENTS

| | | | |
|---|---|---|---|
| 2,954,308 | 9/1960 | Lyons | 148—189X |
| 2,994,621 | 8/1961 | Hugle et al. | 148—174X |
| 3,092,591 | 6/1963 | Jones et al. | 252—62.3X |
| 3,108,072 | 10/1963 | Gutsche | 252—62.3 |
| 3,139,599 | 6/1964 | Mesecke | 252—62.3X |
| 3,141,849 | 7/1964 | Enk et al. | 252—62.3 |
| 3,167,461 | 1/1965 | Compton | 148—175 |
| 3,175,975 | 3/1965 | Fuller | 252—62.3 |
| 3,313,663 | 4/1967 | Yeh et al. | 148—189X |
| 3,462,323 | 8/1969 | Groves | 148—175 |

OTHER REFERENCES

Wieder, H. H.: "Crystallization and Properties of InSb Films Grown From A Nonstoichiometric Liquid" Solid State Communications, vol. 3, pp. 159–160, 1965.

L. DEWAYNE RUTLEDGE, Primary Examiner

W. G. SABA, Assistant Examiner

U.S. Cl. X.R.

23—204; 117—200; 148—1.5, 175; 252—62.3